Nov. 4, 1969 D. JAHN 3,476,661
PROCESS FOR INCREASING THE REVERSE VOLTAGE OF THERMALLY OXIDIZED SILICON MEMBERS WITH AT LEAST ONE BARRIER LAYER
Filed April 11, 1966
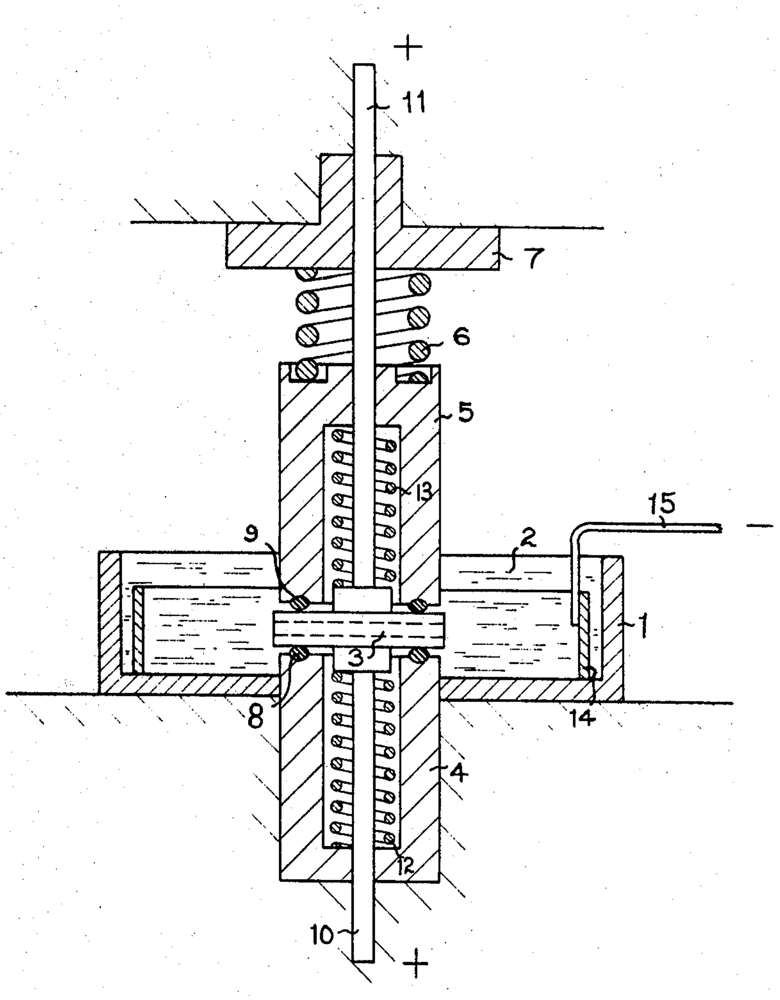
INVENTOR.
Dieter Jahn
BY
Pierce, Scheffler & Parker
Attorneys United States Patent Office 3,476,661
Patented Nov. 4, 1969

3,476,661

PROCESS FOR INCREASING THE REVERSE VOLTAGE OF THERMALLY OXIDIZED SILICON MEMBERS WITH AT LEAST ONE BARRIER LAYER

Dieter Jahn, Neuenhof, Aargau, Switzerland, assignor to Aktiengesellschaft Brown, Boveri & Cie, Baden, Switzerland, a joint-stock company Filed Apr. 11, 1966, Ser. No. 541,676
Claims priority, application Switzerland, Apr. 27, 1965, 5,865/65
Int. Cl. B01k 3/00
U.S. Cl. 204—140 6 Claims

ABSTRACT OF THE DISCLOSURE

A process for recovering maximum reverse breakdown voltage at the exposed edge of a p-n junction area within a silicon disc semiconductor element which has been protected by covering the edge with a thermally produced oxide layer which comprises the step of subjecting the oxide layer coated edge to an electrolytic treatment. The silicon disc is immersed in an electrolytic bath and held in place between two support members and two sealing rings which limit the electrolytic treatment to the edge portion of the disc. When direct current is employed, a counter electrode is placed in the bath. When alternating current is utilized, the counter electrode is omitted.

The present invention relates to an improved process for increasing the maximum reverse voltage of a semi-conductor element having a thermally oxidized silicon member with at least one p-n junction.

It is known that in semi-conductor components with a substantially monocrystalline semi-conductor member consisting of silicon and comprising one or more p-n junctions those places at which a p-n junction comes to the surface must be protected from external effects. This may be done, for example, by oxidizing the surface of the crystal. Thus, for example, silicon semi-conductor elements which have to a large extent stable characteristics with respect to atmospheric effects are made from a semi-conductor disc, wherein a p-n junction has been formed, e.g. by a diffusion process by exposing the edge of the p-n junction by mechanical and/or chemical removal of the semi-conductor material along a line on an edge surface of the semi-conductor disc, and then producing a layer of $SiO_2$ for the purpose of protecting this line. A customary process for oxidizing silicon is to treat the crystal with dry or humid oxygen at temperatures of between 800 and 1300° C. Dense layers of $SiO_2$ about 1$\mu$ thick are produced in this way.

It has now been determined that the said thermal oxidization frequently leads to impairment of the reverse blocking action of the semi-conductor element which has been treated. A considerable reduction in reverse voltage for a given reverse current is found after thermal oxidization has been carried out, especially in the case of silicon semi-conductor elements, which originally exhibit a very high maximum reverse voltage. Similar difficulties are known in the case of semi-conductor elements made by the planar method, wherein p-n junctions are produced by diffusion into silicon masked with $SiO_2$, only part of the surface being covered with $SiO_2$.

It is the object of the present invention to provide a process by means of which an increase is imparted to the maximum reverse voltage of thermally oxidized silicon members with at least one p-n junction. The improved process is characterized in that at least the region of the $SiO_2$ layer covering the edge of the barrier p-n junction is subjected to an electrolytic treatment.

According to the process, the thermally oxidized silicon member is brought into contact with an electrolyte at the point where the $SiO_2$ layer covers the edge of a p-n junction. The electrolyte preferably takes the form of a solution of an inorganic salt in an organic solvent with at most a small water content, as is customary in the case of an electrolyte for electrolytic oxidization. It is also possible, for example, to use a solution of 4% boric acid in water as the electrolyte.

In order to produce a small flow of current through the $SiO_2$ layer covering the edge of the p-n junction, a counter-electrode is, for example, introduced into the electrolyte, and a direct voltage is applied between this electrode and the silicon member which is equipped with a contact, the positive pole of the direct voltage being connected to the silicon member, which acts as the anode. It has been found also to be possible, using the rectifying action of the p-n junction or junctions, to apply an alternating voltage across contacts fitted on both sides to the silicon member, and thus to dispense with the counter-electrode in the electrolyte.

The process will be more precisely described hereinafter with reference to an example and to the single figure, which shows an arrangement suitable for carrying out the process.

Monocrystalline n-type silicon discs having a diameter of 19 mm. and a thickness of 300$\mu$ were provided in known manner with a superficial p-doped zone penetrating to a depth of 100$\mu$ by diffusing aluminum into the disc surfaces. Thereupon, about a layer of 1 mm. thickness was mechanically removed from the edge of the discs, and taken off for 15$\mu$ on all sides, likewise in known manner, by etching the discs in a mixture of nitric acid, hydrofluoric acid and acetic acid. After the discs had been washed and dried, the following maximum reverse votlages were measured across the two p-n junctions with a reverse current of 5 ma.:

Sample No. 1—reverse voltages 1080/1080.
Sample No. 2—reverse voltages 900/940.
Sample No. 3—reverse voltages 940/970.

After the samples had been oxidized in known manner in dry oxygen for one hour, with a resultant formation of a layer of $SiO_2$ about 0.1$\mu$ thick, the following greatly reduced maximum reverse voltages were measured:

Sample No. 1—reverse voltages 20/20.
Sample No. 2—reverse voltages 15/30.
Sample No. 3—reverse voltages 15/15.

The edges of the samples were now subjected to an electrolytic treatment according to the process of the invention. An arrangement as shown in the figure is suitable for this purpose. Reference numeral 1 designates a vessel filled with the electrolyte 2. The thermally oxidized silicon member 3, comprising two p-n junctions in the example shown, is immersed in the electrolyte 2. The underside and top of the silicon member 3 are covered by tubular plungers 4 and 5, so that it comes into contact with the electrolyte 2 in its edge zone only. The lower plunger 4 is fixed to the vessel, while the upper plunger 5 is arranged to be movable, and is pressed against the surface of the silicon member 3 by means of a spring 6 bearing against the fixed abutment 7. The rubber rings 8 and 9 between the plungers and the silicon member 3 are provided for sealing purposes. The contact plungers 10 and 11, which are located inside the tubular plungers 4 and 5, press on both sides against the surfaces of the silicon member 3. The pressure is exerted by the springs 12 and 13.

The counter-electrode 14, which takes the form of a sheet-platinum cylinder, is accommodated in the electrolyte. The negative pole of a direct-voltage source, not shown, is connected by the lead-in 15 to the counter electrode 14, while the positive pole of the said source is connected to the two contact plungers 10 and 11.

In the present example, the electrolyte took the form of potassium nitrate dissolved in a quantity of 0.04 mol/l. in N-methyl acetamide. Electrolysis was carried on for one hour, with the following constant electrolysis voltages:

Sample No. 1—electrolysis voltage 165.
Sample No. 2—electrolysis voltage 50.
Sample No. 3—electrolysis voltage 100.

After the electrolytic treatment was finished, the samples were washed with water and dried. Thereupon, the samples exhibited the following maximum reverse voltages:

Sample No. 1—reverse voltages 740/740.
Sample No. 2—reverse voltages 720/800.
Sample No. 3—reverse voltages 660/740.

It is apparent from the above that the process to a large extent cancels the reduction in reverse voltage caused by thermal oxidization of the silicon member.

A substantially identical advantageous effect may be attained if an alternating voltage of about 100 is applied across the two contact plungers 10 and 11, the counter-electrode 14 being omitted. Furthermore, substantially the same results may be obtained if the solvent for potassium nitrate takes the form, for example, of ethylene glycol with at most 2% water.

I claim:

1. A process for increasing maximum reverse breakdown voltage at the edge of a p-n junction within a silicon disc semi-conductor element which has been protected by covering with a thermally produced oxide coating which comprises the steps of blocking off all surface portions of said oxide coated disc except an edge portion thereof, and subjecting only said oxide coated edge portion to electrolytic treatment while said silicon disc is immersed in an electrolytic bath.

2. The process according to claim 1 wherein said electrolytic bath includes a counter-electrode and said electrolytic treatment is carried out by applying a unidirectional voltage between said counter-electrode and said silicon disc.

3. The process according to claim 1 wherein said electrolytic treatment is carried out by applying an alternating voltage between contacts on both sides of said silicon disc.

4. The process according to claim 1, wherein said electrolyte is constituted by a solution of an inorganic salt in an organic solvent with at most a small water content.

5. The process according to claim 1, wherein said electrolyte is constituted by potassium nitrate dissolved in N-methyl acetamide.

6. The process according to claim 1, wherein said electrolyte is constituted by potassium nitrate dissolved in ethylene glycol with at most 2% water.

References Cited

UNITED STATES PATENTS

| | | | |
|---|---|---|---|
| 2,868,702 | 1/1959 | Brennan | 204—28 |
| 2,974,097 | 3/1961 | Ramirez et al. | 204—206 |
| 2,995,502 | 8/1961 | Ramirez et al. | 204—15 |
| 3,264,201 | 8/1966 | Schink et al. | 204—56 |
| 3,365,378 | 1/1968 | Maissel et al. | 204—38 |

JOHN H. MACK, Primary Examiner

W. B. VANSISE, Assistant Examiner

U.S. Cl. X.R.

29—584; 204—15, 224, 35, 32